United States Patent
Bandy et al.

(10) Patent No.: US 6,576,507 B1
(45) Date of Patent: Jun. 10, 2003

(54) SELECTIVELY REMOVABLE FILLER LAYER FOR BICMOS PROCESS

(75) Inventors: Kenneth A. Bandy, Milton, VT (US); Stuart D. Cheney, Essex Junction, VT (US); Gary L. Milo, Williston, VT (US); Yutong Wu, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 09/712,510

(22) Filed: Nov. 14, 2000

(51) Int. Cl.[7] .......................................... H01L 21/8249
(52) U.S. Cl. ...................... 438/234; 438/657; 438/626
(58) Field of Search ............................... 438/310, 379, 438/396, 234, 359, 657, 684, 626, 631, 632, 633

(56) References Cited

U.S. PATENT DOCUMENTS

| | | | |
|---|---|---|---|
| 5,302,551 A | | 4/1994 | Iranmanesh et al. ......... 437/195 |
| 5,466,636 A | | 11/1995 | Cronin et al. ................. 437/187 |
| 5,518,961 A | * | 5/1996 | Ishimaru ....................... 438/657 |
| 5,573,633 A | | 11/1996 | Gambino et al. ........... 156/636.1 |
| 5,618,757 A | | 4/1997 | Bothra et al. ................. 438/699 |
| 5,627,104 A | | 5/1997 | Bryant et al. ................. 438/631 |
| 5,663,107 A | | 9/1997 | Peschke et al. .............. 438/692 |
| 5,670,018 A | | 9/1997 | Eckstein et al. ........... 156/643.1 |
| 6,066,536 A | * | 5/2000 | Lin .............................. 438/379 |
| 6,080,672 A | * | 6/2000 | Juengling et al. ............ 438/692 |
| 6,143,646 A | * | 11/2000 | Wetzel ......................... 438/637 |
| 6,261,898 B1 | * | 7/2001 | Wu .............................. 438/241 |

* cited by examiner

*Primary Examiner*—Caridad Everhart
(74) *Attorney, Agent, or Firm*—Anthony J. Canale; Howard J. Walter

(57) ABSTRACT

The present invention is intended for use on BiCMOS technology where the BJTs are formed after the FETs. A thin FET protection layer 26 is deposited on the raised and recessed regions 28 of the semiconductor substrate 10. A selectively removable filler layer 30 is then deposited on the FET protection layer 26 with a thickness to over-fill the recessed regions 28 of the gates 24 of the FETs. The selectively removable filler layer 30 is then planarized until the FET protection layer 26 on top of the gates 24 is exposed. The recessed regions 28 between the gates 24 are left substantially filled with selectively removable filler layer 30. The selectively removable filler layer 30 in the region where the BJT is formed is patterned and an opening 32 is made to allow for the depositing of layers of different materials 34, 36, 38, 40, 42, 44 used in the construction of the BJT. The layer of different materials 34, 36, 38, 40, 42, 44 are processed by methods known in the art to form polysilicon emitter 46 of the BJT. Due to selectively removable filler layer 30 creating a substantially planar surface in the recessed regions 28 of the FETs, little to none of the layers of different materials 34, 36, 38, 40, 42, 44 that are used in the construction of the BJT are deposited within the recessed regions 28. Thus, removal of the layers of different materials 34, 36, 38, 40 (40'), 42, 44 from the FET region is simplified. After removal of the layers of different materials 34, 36, 38, 40 (40'), 42, 44 from the FET region, the selectively removable filler layer 30 is removed selectively to the FET protection layer 26. The FET protection layer 26 is then removed. The recessed regions 28 between the gates 24 of the FETs are free from residual films.

19 Claims, 5 Drawing Sheets

SELECTIVELY REMOVABLE FILLER LAYER FOR BICMOS PROCESS

FIELD OF THE INVENTION

The present invention relates to semiconductor processing and particularly to processing of silicon germanium (SiGe) bipolar junction transistor—complementary metal oxide semiconductor (BiCMOS) technology.

BACKGROUND

The combination of bipolar junction transistor (BJT) and field effect transistor (FET) devices on the same semiconductor substrate can pose processing problems since different processes are required to form each type of transistor. A BJT typically consists of a base/emitter/collector structure formed by the deposition and etching of layers of different materials. Typically, the base, emitter and collector of the BJT are electrically isolated from each other by at least one layer of dielectric material. An FET typically consists of a source/drain/gate structure where the source and drain are doped regions within the semiconductor substrate and the gate is formed on top of the semiconductor substrate between the source and drain regions. The gate is typically made of at least one layer of material and forms a raised region on the substrate.

During processing to form the FETs, high temperatures may be required for processes such as annealing or film deposition. For BiCMOS technologies where the high temperatures used to form the FETs exceed the thermal budget of the BJTs, the BJTs are formed after the FETs. With the gate structure of the FETs formed as raised regions on the substrate and the BJTs formed by the deposition and etching of layers of different materials, process problems are encountered.

SUMMARY OF THE INVENTION

The current invention will describe a method to utilize a sacrificial film to eliminate the problem of residual thin films remaining between the gates of FETs during the formation of the BJTs in a BiCMOS device. The BiCMOS device is formed on a semiconductor substrate. The method of the current invention includes processing the substrate to form the FETs of the BiCMOS device. The FET consists of a source/drain region, gate oxide, gate films and gate spacer oxide resulting in raised and recessed regions on the surface of the semiconductor substrate. A thin FET protection layer is then deposited on the surface of the semiconductor substrate. A selectively removable filler layer is then deposited on the FET protection layer and over-fills the recessed regions. The selectively removable filler layer is planarized down to the top of the raised regions and thus substantially fills the recessed regions. An opening is made in the selectively removable filler layer in the region where the BJT is to be formed. Multiple layers of different materials are deposited and removed during the construction of the BJT. Since the recessed regions of the FETs are filled with the selectively removable filler layer, little to none of the layers of different materials are deposited in the recessed regions allowing for easy removal of the layers. After removal of the multiple layers of different materials from the FET region, the selectively removable filler layer and the FET protection layer are also removed resulting in recessed regions between the gates of the FETs free from residual thin films.

The advantages of this invention will become apparent from the following detailed description of the presently preferred embodiment of the invention, taken in conjunction with the accompanying drawings.

Figure 1:
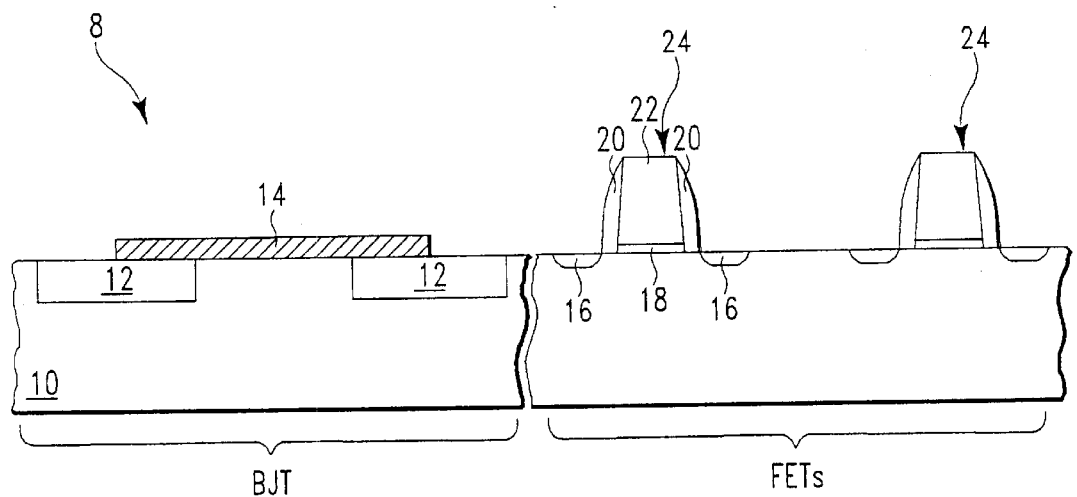
FIG. 1 is a cross-section of a BiCMOS device showing the FETs formed first and the area where the BJT is to be formed.

In the drawings, the relative thicknesses of the various layers and structure illustrated are not necessarily to scale.

DESCRIPTION OF THE PREFERRED EMBODIMENTS

The present invention is intended for use on SiGe BiCMOS where layers of different materials are formed sequentially as part of the BJT construction and all of the layers of different materials must be removed from the FET areas. One problem that can arise when the FETs are already formed prior to the BJT construction is the tendency of the layers of different materials to form "mini-spacers" in the recessed regions between the gates of the FETs. By using a selectively removable filler layer to cover the FETs, the removal of the layers of different materials from the FETs can be accommodated using nominal amounts of over-etch without the possibility of leaving "mini-spacers". The present invention will be described with reference to FIGS. 1–9.

FIG. 1 illustrates a BiCMOS device 8 in accordance with the present invention. The FETs are formed first and then the BJTs are formed subsequently in a region adjacent to the FETs. The FETs are formed by process methods well known in the art such as ion implantation to form source/drain regions 16. Gates 24 of the FETs are also formed by process methods well known in the art such as deposition of one or more films, patterning gates 24 using photolithography, etching of gate films 22 and gate oxide 18, and forming gate spacer oxides 20 along the sidewalls of gate films 22 resulting in the raised gate structures shown in FIG. 1 formed on the surface of semiconductor substrate 10. Any films used to form the gates of the FETs are simultaneously removed from the regions where the BJTs will be formed so that the surface of semiconductor substrate 10 in the BJT regions is free from films used to form the gates. Oxide regions 12 serve as a means for electrical isolation for the BJT device. Nitride protection layer 14 is a sacrificial thin film used to protect the top surface of semiconductor substrate 10 in the region where the BJT device is formed.

Figure 2:
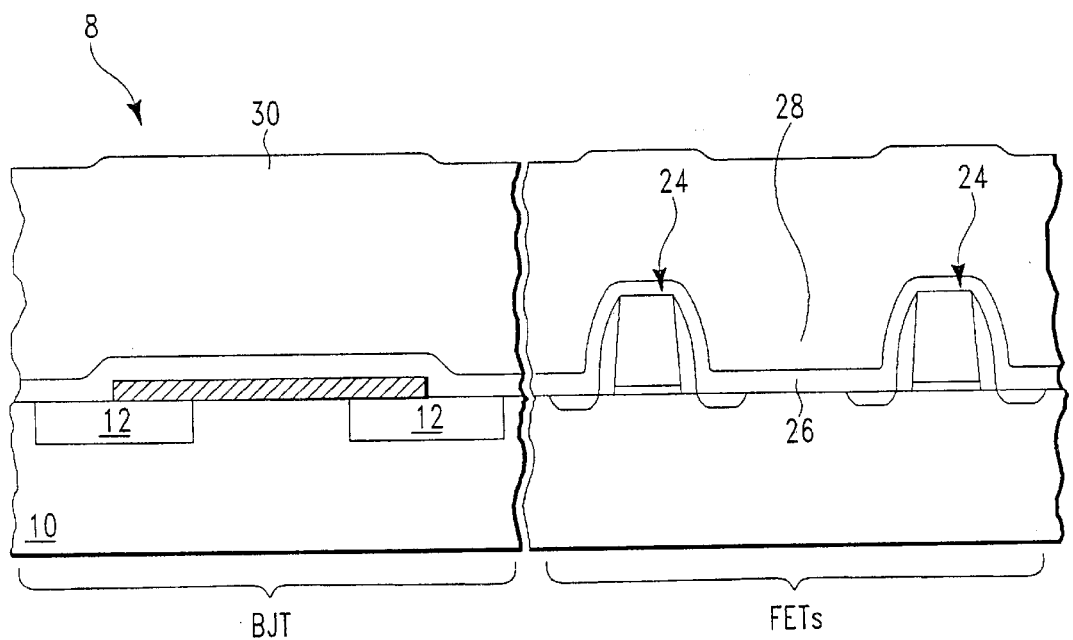
FIG. 2 is a cross-section of the BiCMOS device of FIG. 1 showing a selectively removable filler layer according to the present invention on the BiCMOS device.

FIG. 2 shows the BiCMOS device 8 of FIG. 1 with an FET protection layer 26 of about 300–400 Angstroms thick on the surface of the raised and recessed regions 28 of semiconductor substrate 10. FET protection layer 26 is used as an etch stop for subsequent etch steps. A selectively removable filler layer 30 is then deposited to over-fill recessed regions 28 between the raised regions of gates 24 of the FETs so as to prevent subsequent layers of different materials from the BJT construction from forming residual thin films in recessed regions 28. Selectively removable filler layer 30 must have a low etch rate compared to the subsequent layers of different materials used to form the BJT so that selectively removable filler layer 30 can be used as an etch stop for the removal of the layers of different materials. In addition, selectively removable filler layer 30 must have a high etch rate compared to FET protection layer 26 so that FET protection layer 26 can be used as an etch stop for the removal of selectively removable filler layer 30. In the present invention, FET protection layer 26 consists of a relatively dense oxide formed by methods known in the art such as chemical vapor deposition (CVD) at a temperature of 400° C. so as to avoid affecting the diffusion regions 16 of the FETs. For an oxide FET protection layer 26, a suitable selectively removable filler layer 30 that meets the above mentioned requirements for selectively removable filler layer 30 is polysilicon. The polysilicon used for selectively removable filler layer 30 of the present invention is un-doped and can be deposited by methods known in the art such as low pressure CVD (LPCVD). A polysilicon thickness of about 3000–4000 Angstroms thick is required to over-fill recessed regions 28 of BiCMOS device 8 of the present invention.

Figure 3:
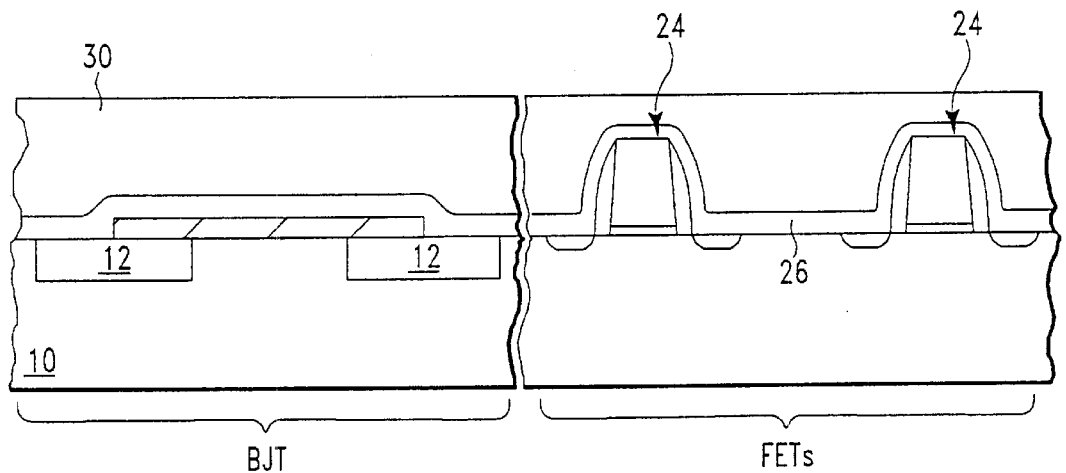
FIG. 3 is a cross-section of the BiCMOS device of FIG. 1 showing the remaining selectively removable filler layer after chemical-mechanical polishing (CMP) of the layer leaving about 500–1000 Angstroms over the FETs.

As shown in FIG. 3, selectively removable filler layer 30 is then planarized until the remaining film is about 500–1000 Angstroms above gates 24 of the FETs. Methods well known in the art such as chemical-mechanical polishing (CMP) can be used to planarize a selectively removable filler layer 30 such as polysilicon. A timed polysilicon CMP of about 2–3 minutes can remove about 2000–3000 Angstroms of polysilicon in order to achieve a remaining 500–1000 Angstroms of polysilicon above gates 24 of the FETs. Due to a lack of a repeatable, automated CMP endpoint detection system for the features of the present invention, namely being able to stop the CMP process when the tops of oxide FET protection layer 26 are exposed, the goal of the CMP process is to purposely under-polish polysilicon selectively removable filler layer 30 to leave the remaining 500–1000 A of polysilicon above gates 24 of the FETs for a subsequent dry etch process with an automated endpoint detection system to more precisely planarize polysilicon selectively removable filler layer 30 down to the top of oxide FET protect layer 26.

Figure 4:
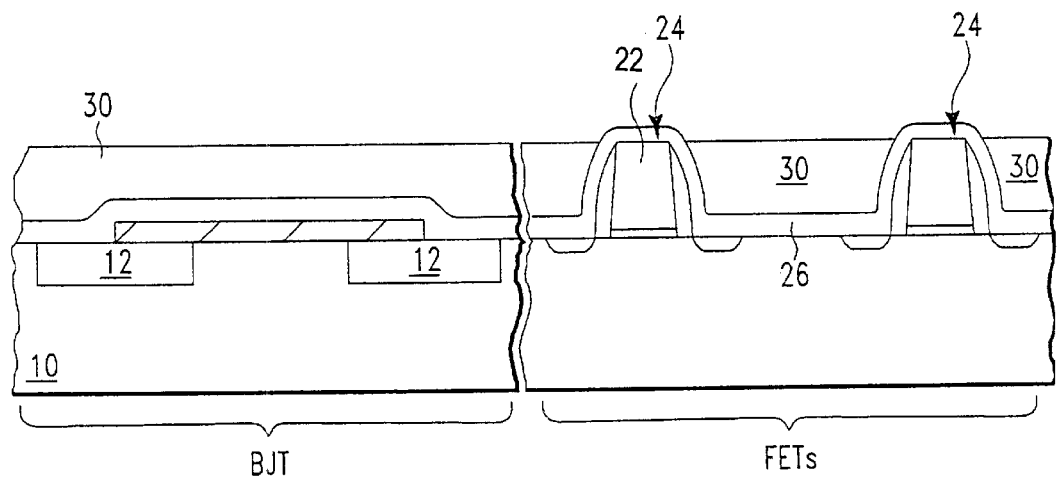
FIG. 4 is a cross-section of the BiCMOS device of FIG. 1 showing the remaining selectively removable filler layer after etching and endpointing when the FET protection layer is exposed on the top surface of the gates according to the preferred embodiment of the present invention.

FIG. 4 illustrates etching of selectively removable filler layer 30 until FET protection layer 26 on top of gates 24 is exposed. Methods well known in the art such as reactive ion etching using an SF6 gas can be used to etch a polysilicon selectively removable filler layer 30 and have very high selectivity to an oxide FET protection layer 26 so that gate films 22 are not etched. Endpoint techniques known in the art such as interferometry or emission endpoint detection can be used to determine when oxide FET protection layer 26 has been exposed and thus indicating that polysilicon selectively removable filler layer 30 is substantially planar with the top surface of gates 24. A real-time feedback system from the endpoint detection system to the reactive ion etch tool is typically employed so that the reactive ion etch process is stopped when endpoint has been detected.

Figure 5:
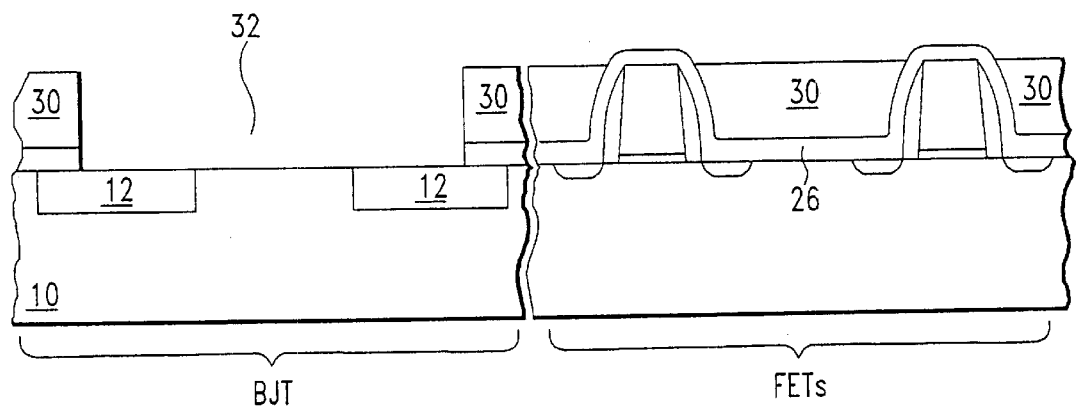
FIG. 5 is a cross-section showing an opening in the selectively removable filler layer where the BJT will be formed.

Selectively removable filler layer 30 is left filling recessed regions 28 between gates 24 which will prevent subsequent layers of different materials used to construct the BJT from becoming trapped within recessed regions 28. As shown in FIG. 5, an opening 32 is made in selectively removable filler layer 30 in the region where the BJT is formed by methods known in the art such as patterning with photo-resist and reactive ion etching. An SF6 reactive ion etch will etch polysilicon selectively removable filler layer 30 at a faster etch rate than underlying oxide FET protection layer 26 so that a sufficient over-etch can be done to ensure that all of the polysilicon has been removed from opening 32 without etching through oxide FET protection layer 26. The exposed oxide FET protection layer 26 and nitride protection layer 14 within opening 32 are removed by methods known in the art. Oxide FET protection layer 26 can be removed by an HF wet etch. Nitride protection layer 14 can be removed an HF/ethylene glycol wet etch.

Figure 6:
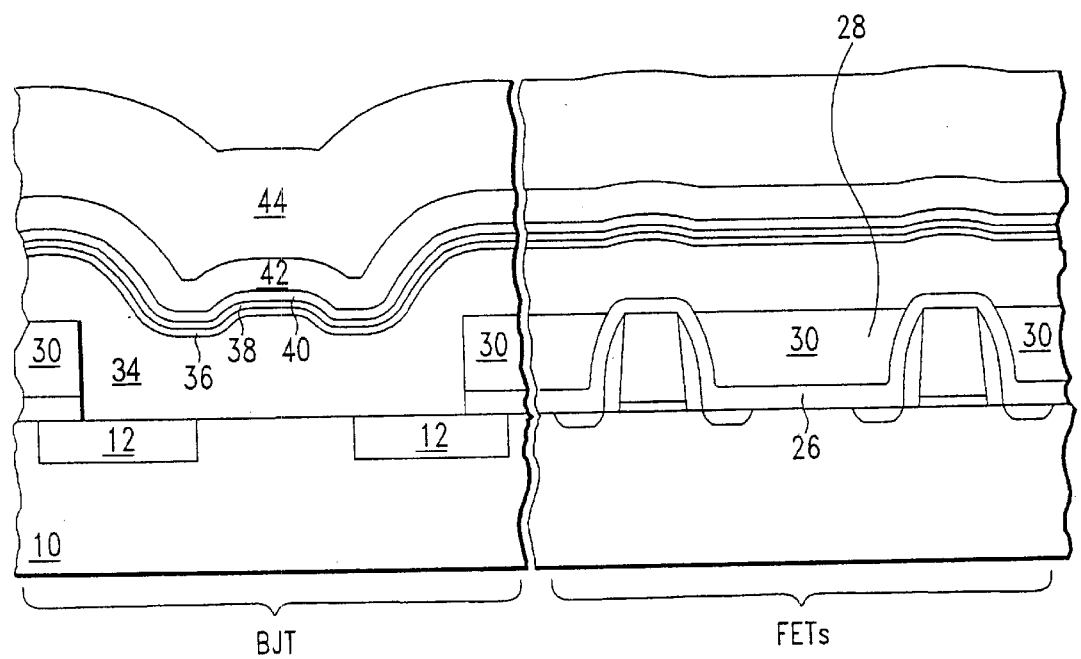
FIG. 6 is a cross-section showing the of layers of different materials used in the formation of the BJT.

FIG. 6 shows the layers of different materials used to construct the BJT formed on a top surface of gates 24 of the FETs and selectively removable filler layer 30. The layers of different materials can be deposited by methods well known in the art such as low pressure epitaxy (LPE) and LPCVD. The layers of different materials used to form the BJT of the present invention consist of germanium doped epitaxial layer 34, base oxide 36, first nitride 38, conversion polysilicon 40, second nitride 42, and TEOS (tetraethylorthosilicate) 44. The approximate deposited thicknesses of the individual layers of materials are: germanium doped epitaxial layer 34 thickness of about 2000 A, base oxide 34 thickness of about 10 A, first nitride 36 thickness of about 200 A, conversion polysilicon 38 thickness of about 450 A, second nitride 40 thickness of about 1000 A, and TEOS 42 thickness of about 3500 A. Since selectively removable filler layer 30 substantially fills recessed regions 28, little to none of the layers of different materials are deposited within recessed regions 28.

Figure 7:
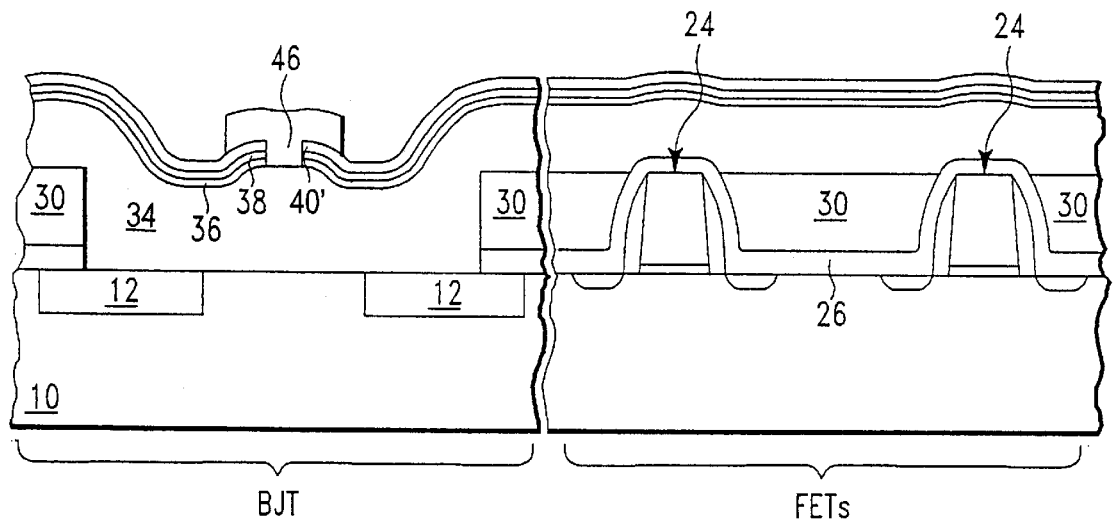
FIG. 7 is a cross-section showing the formation of the polysilicon emitter of the BJT and the remaining layers of different materials.

The layers of different materials are then patterned and etched by methods well known in the art, such as photolithography and etch processes, to form polysilicon emitter 46 of the BJT as shown in FIG. 7. FIG. 7 also shows the remaining layers of different materials on the top surface of gates 24 of the FETs and selectively removable filler layer 30. The remaining layers of different materials consist of germanium doped epitaxial layer 34, base oxide 36, first nitride 38, and oxide 40' formed by the transformation of conversion. polysilicon 40.

Figure 8:
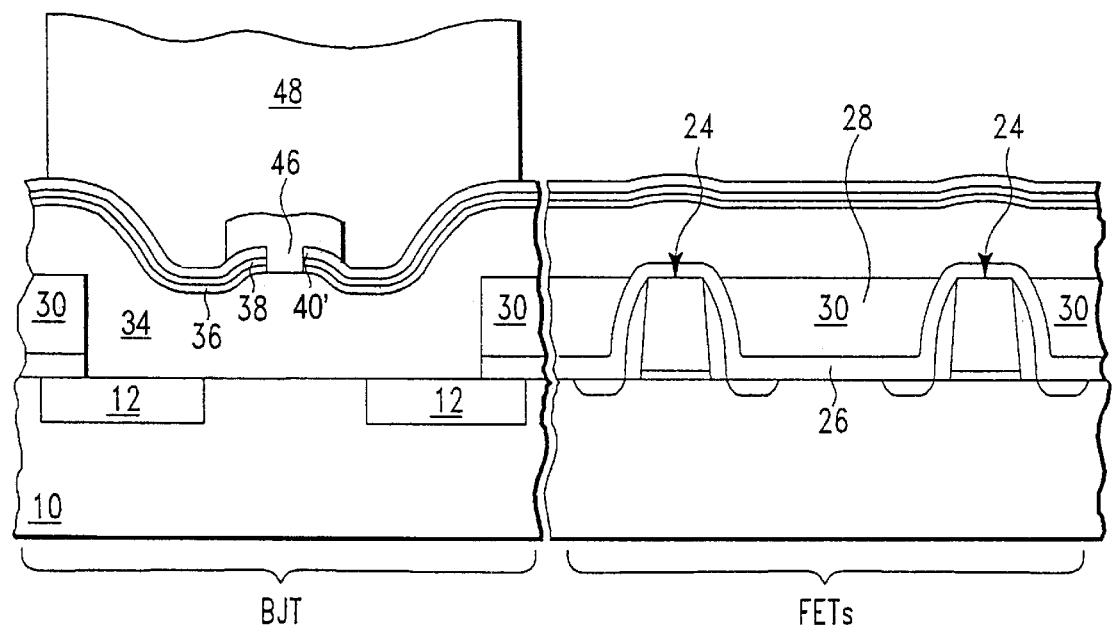
FIG. 8 is a cross-section showing a photo-resist mask used to protect the BJT during removal of the remaining layers of different materials, the selectively removable filler layer and the FET protection layer.

FIG. 8 shows photo-resist pattern 48 defining the region where the remaining layers of different materials (germanium doped epitaxial layer 34, base oxide 36, first nitride 38, and oxide 40'), selectively removable filler layer 30, and FET protection layer 26 are to be completely removed. The remaining layers of base oxide 36, first nitride 38, and oxide 40' are removed by methods well known in the art such as reactive ion etching using a CHF3/CF4 gas mixture which has a high selectivity to the underlying germanium doped epitaxial layer 34 and the selectively removable filler layer 30. The high selectivity of germanium doped epitaxial layer 34 and selectively removable filler layer 30 to the remaining layers of base oxide 36, first nitride 38, and oxide 40' being etched, along with the substantially planar surface of selectively removable filler layer 30, allows for all of the remaining layers of base oxide 36, first nitride 38, and oxide 40' to be removed with no materials left in the substantially filled recessed regions 28 of the FETs. Germanium doped epitaxial layer 34 can be removed at the same time that selectively removable filler layer 30 is removed. Polysilicon selectively removable filler layer 30 can be removed selectively to oxide FET protection layer 26 with either a wet or dry etch. The etch must be substantially isotropic so that all of the polysilicon is removed from along gate spacer oxide 20 of gates 24. A reactive ion etch using SF6 gas will etch polysilicon in an isotropic manner with a high selectivity to oxide FET protection layer 26. The reactive ion etch using SF6 gas will also etch germanium doped epitaxial layer 34 at an etch rate comparable to the etch rate of polysilicon selectively removable filler layer 30. Once germanium doped epitaxial layer 34 and polysilicon selectively removable filler layer 30 are removed, oxide FET protection layer 26 can be removed by using a buffered hydro-flouric (HF) wet etch in a 500:1 concentration. A buffered HF wet etch in a 500:1 concentration will etch oxide FET protection layer 26 at a higher rate than gate spacer oxide 20 so that the amount of gate spacer oxide 20 etched during the removal of oxide FET protection layer 26 will be minimal.

Figure 9:
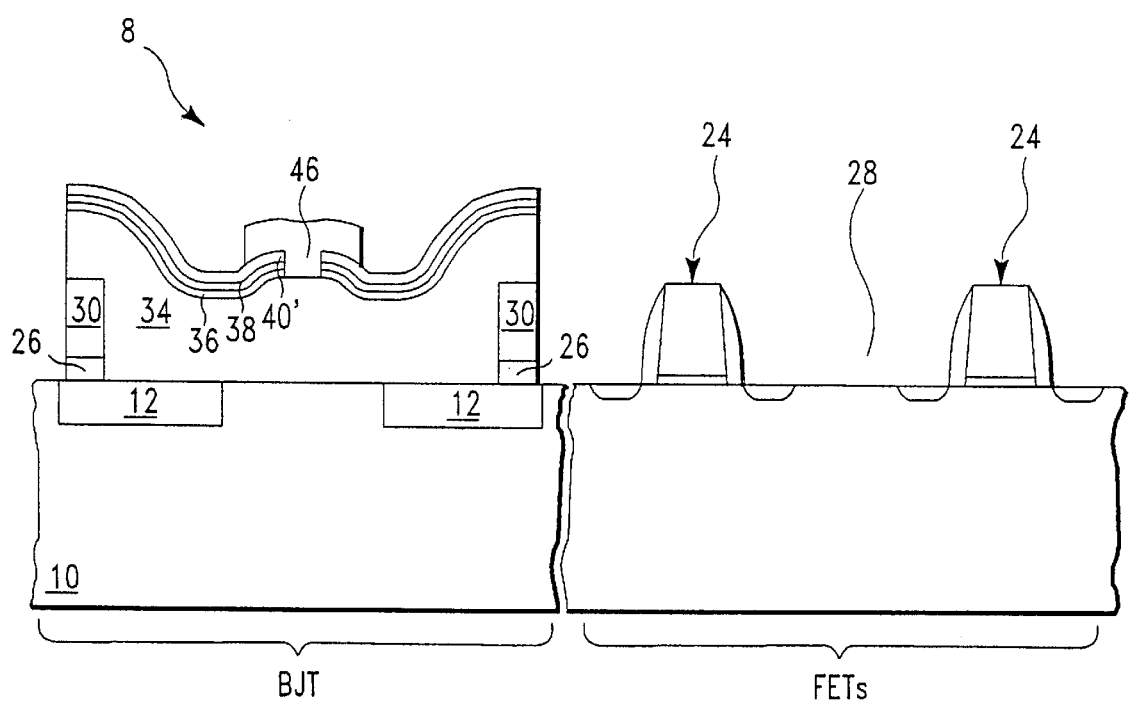
FIG. 9 is a cross-section of the BiCMOS device according to the present invention showing the formation of the polysilicon emitter of the BJT and the FET devices after removal of the selectively removable filler layer and the FET protection layer.

FIG. 9 shows the remaining layers of different materials (germanium doped epitaxial layer 34, base oxide 36, first nitride 38, and oxide 40') and polysilicon emitter 46 in the BJT region of BiCMOS device 8 after photo-resist pattern 48 is removed by a photo-resist strip method well known in the art such as an oxygen ash. Recessed regions 28 between gates 24 of the FETs have no residual thin films remaining from the construction of the BJT.

It should be understood that the invention is not limited to the illustrated BiCMOS device and the method for forming the BiCMOS device. Further, the invention can be embodied by adding a variety of improvements, modifications, and changes, based on knowledges of those skilled in the art within a scope that does not deviate from the essentials of the invention. For example, a second embodiment can have polysilicon selectively removable filler layer 30 as shown in FIG. 3 planarized by dry etch methods which are well known in the art such as a reactive ion etch using an SF6 gas instead of CMP as shown in the description of the preferred embodiment. A third embodiment can eliminate the processing described by FIG. 4 so that there is 500–1000 A of selectively removable filler layer 30 remaining above gates 24 of the FETs. In the third embodiment, subsequent processing steps as outlined in FIG. 5 thru FIG. 9 remain unchanged. A fourth embodiment can use a wet etch for the removal of polysilicon selectively removable filler layer 30 as described in FIG. 9. Potassium hydroxide (KOH) is known in the art as a wet etch chemistry which can etch polysilicon at a faster etch rate than oxide. A KOH wet etch would be well suited as a substitute for the SF6 dry etch described in the preferred embodiment. In a fifth embodiment, raised and recessed regions 28 adjacent to the BJT can be any structure used in semiconductor fabrication such as metal lines. In a sixth embodiment, a stacked capacitor or contact can be formed in opening 32 adjacent to raised and recessed regions 28. Thus, a variety of embodiments for the BiCMOS device and the method for forming the BiCMOS device related to the present invention have been described by referring to the drawings.

What is claimed is:

1. A method of processing a semiconductor substrate comprising the steps of:
    processing the substrate to form a surface having a plurality of raised regions separated by adjacent recessed regions;
    providing a selectively removable filler layer consisting of polysilicon substantially filling said recessed regions;
    selectively removing portions of said filler layer to expose at least a portion of at least one recess;
    forming a plurality of layers of different materials on the surface of said substrate; and
    removing said layers and said filler layer from at least some of said recessed regions.

2. The method of claim 1, wherein said plurality of raised regions separated by adjacent recessed regions comprise FETs or metal lines.

3. The method of claim 1, wherein said polysilicon is un-doped.

4. The method of claim 3, wherein said un-doped polysilicon is deposited using LPCVD.

5. The method of claim 1, wherein said selectively removable filler layer is substantially planar with a top surface of said raised regions.

6. The method of claim 5, wherein said filler layer is planarized by CMP or dry etching.

7. The method of claim 1, wherein at least a portion of a BJT, stacked capacitor or contact is formed in said exposed portion of at least one recess.

8. The method of claim 1, wherein said portion of said filler layer to be removed is defined by patterning photo-resist using photolithography.

9. The method of claim 8, wherein said portions of said filler layer are removed using a dry etch process comprising an SF6 gas.

10. The method of claim 8, wherein said portions of said filler layer are removed using a wet etch process comprising KOH.

11. The method of claim 1, wherein said plurality of layers of different materials are deposited on the surface of said substrate by LPE or LPCVD.

12. The method of claim 1, wherein said plurality of layers of different materials are used to form at least a portion of a BJT.

13. The method of claim 12, wherein said plurality of layers of different materials are selected from the group consisting of germanium doped epitaxial layer, base oxide, first nitride, conversion polysilicon, second nitride, and TEOS.

14. The method of claim 1, wherein said at least portions of said layers and of said filler layer are defined by patterning photo-resist using photolithography.

15. The method of claim 1, wherein said at least portions of said layers are removed using a dry etch comprising CHF3/CF4 gases.

16. The method of claim 1, wherein said at least portions of said filler layer are removed using a dry etch comprising SF6 gas.

17. The method of claim 1, wherein said at least portions of said filler layer are removed using a wet etch comprising KOH.

18. A method of processing a semiconductor substrate comprising the steps of:
    processing the substrate to form a surface having a plurality of raised regions separated by adjacent recessed regions;

providing a selectively removable filler layer consisting of polysilicon on said raised regions and filling said recessed regions;

selectively removing portions of said filler layer to expose at least a portion of at least one recess;

forming a plurality of layers of different materials on the surface of said substrate; and removing said layers and said filler layer from at least some of said recessed regions.

19. The method of claim 18, wherein portions of said selectively removable filler layer and said raised regions share a common surface, said filler layer has a second surface opposing said common surface, the thickness of said filler layer as measured between said common surface and said second surface being about 500 to about 1000 Angstroms.

* * * * *